United States Patent
Murakami (10) Patent No.: US 9,501,354 B2
(45) Date of Patent: Nov. 22, 2016

(54) SEMICONDUCTOR MEMORY DEVICE

(71) Applicant: Winbond Electronics Corp., Taichung (JP)

(72) Inventor: Hiroki Murakami, Saitama (JP)

(73) Assignee: WINBOND ELECTRONICS CORP., Taichung (TW)

( * ) Notice: Subject to any disclaimer, the term of this patent is extended or adjusted under 35 U.S.C. 154(b) by 9 days.

(21) Appl. No.: 14/619,639

(22) Filed: Feb. 11, 2015

(65) Prior Publication Data

US 2015/0254132 A1 Sep. 10, 2015

(30) Foreign Application Priority Data

Mar. 6, 2014 (JP) .................................. 2014-043457

(51) Int. Cl.
G11C 29/00 (2006.01)
G06F 11/10 (2006.01)
G11C 29/04 (2006.01)

(52) U.S. Cl.
CPC .... G06F 11/1048 (2013.01); *G11C 2029/0411* (2013.01)

(58) Field of Classification Search
CPC ................... G06F 11/1048; G11C 2029/0411
See application file for complete search history.

(56) References Cited

U.S. PATENT DOCUMENTS

| | | | | |
|---|---|---|---|---|
| 4,500,926 A * | 2/1985 | Yoshimaru | ............. | H04N 1/419 358/426.12 |
| 5,652,857 A * | 7/1997 | Shimoi | ................. | G06F 3/0601 710/68 |
| 8,560,918 B1 | 10/2013 | Yang | | |
| 2006/0271761 A1 | 11/2006 | Riemens | | |
| 2011/0154158 A1 | 6/2011 | Yurzola et al. | | |
| 2011/0161774 A1* | 6/2011 | Shin | ..................... | G06F 11/1012 714/755 |
| 2011/0320913 A1* | 12/2011 | Stracovsky | ......... | G06F 11/1012 714/763 |
| 2012/0023387 A1* | 1/2012 | Wang | .................. | G06F 11/1048 714/773 |
| 2013/0254441 A1 | 9/2013 | Kipnis et al. | | |

FOREIGN PATENT DOCUMENTS

JP    2005-4288 A    1/2005
JP    2010-152989 A    7/2010

(Continued)

OTHER PUBLICATIONS

Office Action issued in corresponding KR patent application on Nov. 19, 2015 with translation (7 pgs.).

*Primary Examiner* — David Ton
(74) *Attorney, Agent, or Firm* — Muncy, Geissler, Olds & Lowe, P.C.

(57) ABSTRACT

A semiconductor memory device includes: a memory array; a data-maintaining component, maintaining data read from the memory array or maintaining data used for writing to the memory array; an external input/output terminal; an error correction component, coupling the data-maintaining component and performing error-detection or correcting the data input to the data-maintaining component or output data from the data-maintaining component; a compressing component, coupling between the external input/output terminal and the error correction component and compressing or extending data. The compressing component compresses data provided by the external input/output terminal, provides the compressed data to the error correction component, extends the data provided by the error correction component, and provides the extended data to the external input/output terminal.

10 Claims, 12 Drawing Sheets (56) References Cited

FOREIGN PATENT DOCUMENTS

| JP | 2011-197819 A | 10/2011 |
| KR | 10-1991-0006981 A | 4/1991 |
| KR | 10-1994-0004820 A | 3/1994 |

* cited by examiner

|  | Erasing | Writing | Reading |
|---|---|---|---|
| Selection Word Line | 0 | 15V~20V | 0 |
| Non-Selection Word Line | F | 10V | 4.5 |
| Selection Gate Line SGD | F | Vcc | 4.5 |
| Selection Gate Line SGS | F | 0 | 4.5 |
| Source Line | F | Vcc | 0 |
| P Well | 21 | 0 | 0 |

|    | Di-1 | Di-2 | Di-3 | Di-4 | Di-5 | Di-6 |
|----|------|------|------|------|------|------|
| Di | A Pattern | A Pattern | A Pattern | A Pattern | A Pattern | A Pattern |
| Dc | Compression Yes | Six times | A Pattern | | | |
|    | 252 | 254 | 256 | | | |

|    | Di-7 |
|----|------|
| Di | B Pattern |
| Dc | Compression No · One time · B Pattern |
|    | 252 · 254 · 256 |

| Dc | Compression Yes | Six times | A Pattern | | |
|---|---|---|---|---|---|
| Di | A Pattern | A Pattern | A Pattern | A Pattern | A Pattern |
| | Di-1 | Di-2 | Di-3 | Di-4 | Di-5 | Di-6 |

252, 254, 256

| Dc | Compression No | One time | B Pattern |
|---|---|---|---|
| Di | B Pattern | | |
| | Di-7 | | |

SEMICONDUCTOR MEMORY DEVICE

CROSS REFERENCE TO RELATED APPLICATIONS

This Application claims priority of Japanese Patent Application No. 2014-043457 filed on Mar. 6, 2014, the entirety of which is incorporated by reference herein.

BACKGROUND OF THE INVENTION

Field of the Invention

The present invention relates to a semiconductor memory device, especially regarding compression, extension or error correction of input/output data.

Description of the Related Art

Since the circuit density of the semiconductor memory such as flash memories or dynamic random access memories (DRAMs) has increased year by year, it has become difficult to manufacture without faulty or defective products. Therefore, regarding the memory chip, a long scheme is needed to detect and compensate for the physical defects of the memory devices occurred in the manufacturing process. For example, long schemes are utilized to compensate the memory chip with physical defects when the large memory is arranged. In addition to the physical compensation of the large memory, the semiconductor memory also includes the error-checking correction (ECC) circuit which corresponds to the software error.

Regarding the NAND-type flash memory, because the programming or erasing is repeatedly performed on the data, the degradation of the tunnel insulation layer results in the degradation of the charge-maintaining ability, and the charges trapped by the tunnel insulation layer results in the variation of the threshold value which causes the bit error. Patent document 1 corresponds to the above bit error and arranges an ECC circuit. It should be noted that due to photolithography, the patterns of the cells near the group selection transistor are not uniform. Since the ion injection is not uniform when the diffusion layer is formed, the bit error increases. Therefore, an ECC code is arranged to execute further compensation.

In addition, Patent document 2 provides a semiconductor device equipped with an error corrector. The error corrector is arranged to perform the error correction on the input data input to the NAND flash memory or the output data from the NAND flash memory. Within the semiconductor device, the connection between the NAND flash memory and the error corrector is adjustable to decrease the area of the circuit.

Patent Document

Patent Document 1: JP2010-152989
Patent Document 2: JP2011-197819

BRIEF SUMMARY OF THE INVENTION

The Problems Solved by the Present Invention

The NAND-type flash memory with an on-chip ECC circuit executes ECC for the overall bit data of reading or programming. It takes much time to execute the operation, especially for the NAND-type flash memory which is read or programmed with a unit of page. When the bit number of a page is increased with the high circuit density, the operation time of the ECC circuit will also be increased proportionally. Therefore, decreasing the reading time or the programming time becomes critical.

The present invention solves the above problems. The goal is to provide a semiconductor memory device which decreases the input/output time of data and also maintains the reliability of the data at the same time.

The Method to Solve the Problem

The present invention provides a semiconductor memory device including a memory array; a data-maintaining component utilized to maintain data which is read from the memory array, or to maintain data which is written to the memory array; an external input/output terminal; an ECC component coupled to the data-maintaining component, utilized to execute error detection or correction for data which is input to the data-maintaining component or output data from the data-maintaining component; and a compression component, coupled between the external input/output terminal and the ECC component, utilized to execute compression or extension for data. The compression component compresses data which is provided by the external input/output terminal, provides the compressed data to the ECC component, extends data which is provided from the ECC component, and provides the extended data to the external input/output terminal.

Ideally, the semiconductor memory device further includes an input/output buffer arranged between the external input/output terminal and the compression component. Ideally, the compression component compresses input data with logic. Ideally, the compression component compresses input data to become data which comprises a data type and a consistency number of the data type. Ideally, the compression component further includes a comparator utilized to compare an input data and a data type; and a counter utilized to count the input data and a consistency number of the data type. Ideally, the compression component further includes a data-type generator utilized to generate a data type of N bytes; and a determining unit utilized to determine whether or not the data type obtained from a comparing result of the comparator is consistent with last data type compared by the comparator; and a compressing data generator utilized to generate compressed data, wherein when the determining unit determines that it is not consistent, the compressing data generator generates a data type and compressing data including consistency number of the data type. Ideally, the compression component further comprises an extender utilized to extend compressed data including data type and consistency number of the data type to become original data. Ideally, the compression component further includes a counter utilized to perform a decrement operation for consistency number of compressed data; and a determining unit utilized to determine whether a counting value of the counter reaches a predetermined value or not. The extender generates connection of the data type until the determining unit determines that the predetermined value is reached. Ideally, the ECC component adds dummy data which is totally "0" or totally "1" for the compressed data.

The Effect of the Present Invention

According to the present invention, the compression component is arranged between the external input/output terminal and the ECC component to perform the extension or compression of data. The operation time could be decreased by the ECC component accordingly. Therefore, the input/output time of data could be decreased.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The embodiments of the present invention are illustrated in detail with the drawings as below. The present invention could be adapted to non-volatile memories with various kinds of memory structures. Accordingly, it is illustrated by the ideal type of the NAND flash memory. In addition, each portion is emphasized in the drawing for comprehension easy. The difference of the sizes of the actual devices should be noted.

Figure 1:
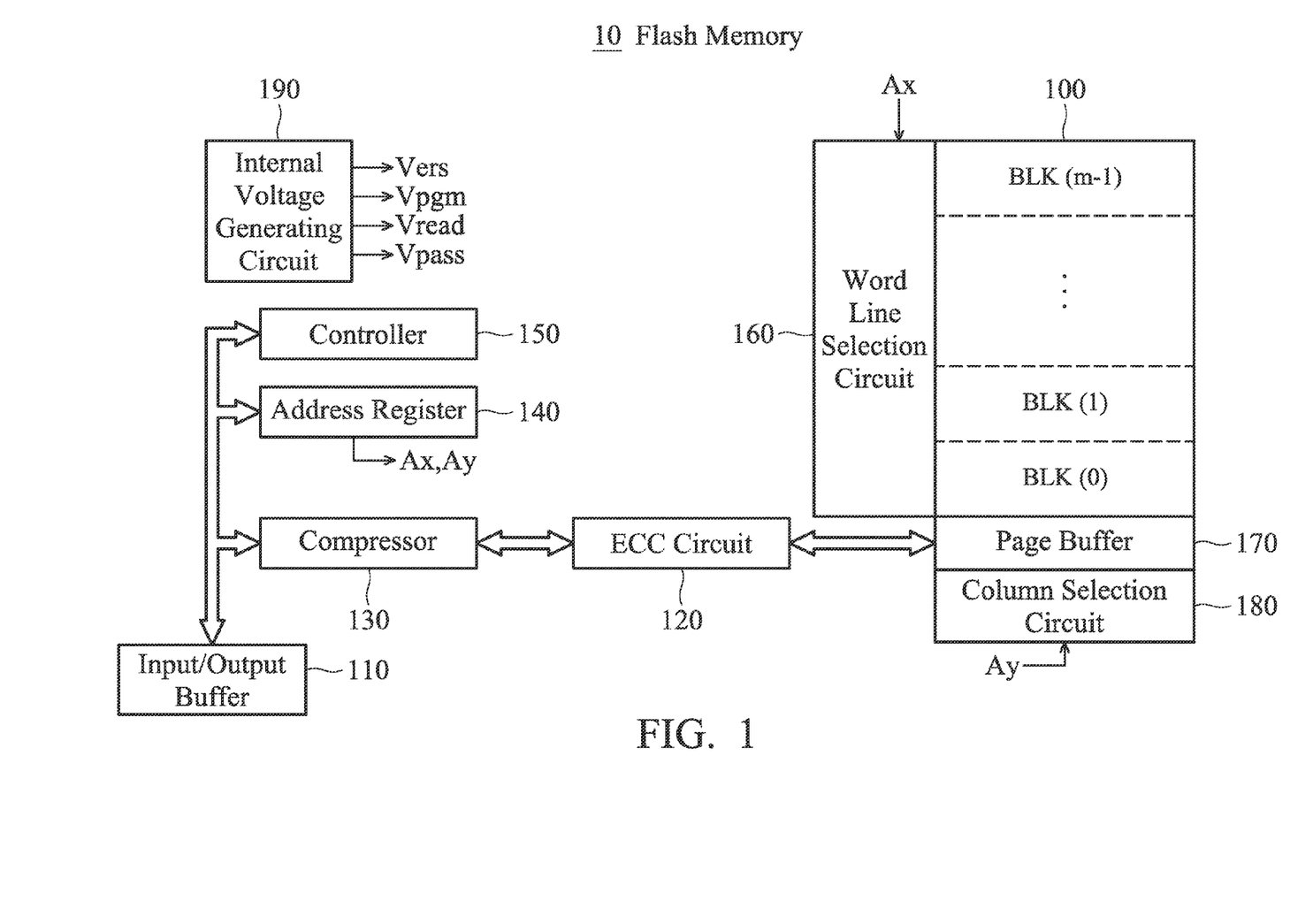
FIG. 1 is an illustration of the typical flash memory according to the embodiment of the present invention.

FIG. 1 is the illustration of a typical flash memory according to an embodiment of the present invention. However, the flash memory illustrated here is only an example, and not for limiting the disclosure of the present invention. The flash memory 10 of the embodiment includes a memory array 100 arranging a plurality of memory cells in rows and columns, a input/output buffer 110 connecting external input/output terminals and maintaining input/output data, an ECC circuit 120 performing error detection and correction for the bit data being read and bit data which should be programmed, a compressor 130 compressing and extending the connection data between the input/output buffer 110 and the ECC circuit 120, an address register 140 receiving address data from the input/output buffer 110, a controller 150 receiving the command data from the input/output buffer 110 or an external control signal and controlling each unit, a word line selection circuit 160 receiving column address information Ax and decoding the column address information and selecting the group and the word line according to the decoding result, a page buffer (sense circuit) 170 maintaining the data which is read from and according to the page selected by the word line selection circuit 160 and maintaining the data which is written to the selected page, a column selection circuit 180 receiving row address information Ay from the address register 140 and decoding the row address information Ay and selecting the page buffer 170 according to the decoding result, and an internal voltage generating circuit 190 reading data and generating all kinds of necessary voltages for programming and erasing (such as the writing voltage Vpgm, the passing voltage Vpass, the reading and passing voltage Vread, the erasing voltage Vers).

The memory array 100 includes m memory blocks BLK(0), BLK(1) . . . BLK(m−1) arranged in columns. The page buffer 170 is arranged close to the memory block BLK(0). In addition to the above arrangement, the page buffer 170 could also be arranged on another terminal of the memory block, or arranged on the terminals of the two sides.

Figure 2:
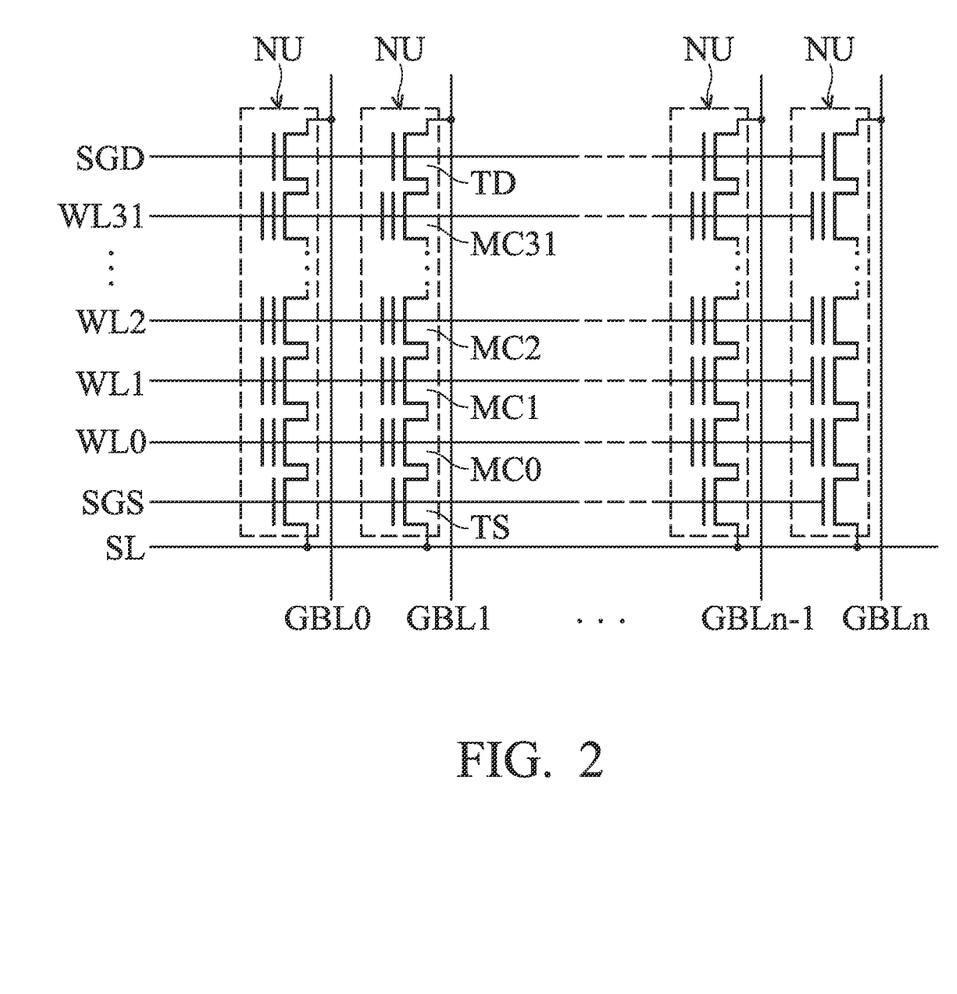
FIG. 2 illustrates circuits of the NAND string units (NUs) according to the embodiment of the present invention.

As shown in FIG. 2, a plurality of the NAND string units (NUs) are formed in a memory block. Each NU is formed in series by a plurality of memory cells. N+1 NUs arranged in rows are included within a memory group. The NU includes a plurality of memory cells MCi (i=0, 1 . . . 31) which are consecutive in series, connects to the selection transistor TD of the drain of the memory cell MC31 of one terminal, and connects to the selection transistor TS of the source of the memory cell MC30 of another terminal. The drain of the selection transistor TD connects to a corresponding bit line GBL, the source of the selection transistor TS connects to the common source line SL.

The control gate of the memory cell MCi connects to the word line WLi. The gates of the selection transistors TD and TS connect to the selection gate lines SGD and SGS which are parallel to the word line WL. When the word line selection circuit 160 selects the group according to the column address information Ax or based on the change of the address, the transistors TD and TS are driven selectively by the signals of the selection gate lines SGS and SGD of the group. The typical cell unit is illustrated in FIG. 2. Regarding the cell unit, one dummy cell or several dummy cells could be included in a NAND NU.

Generally, the memory cell includes a source and a drain formed in the N-type diffusion region in the P well, a tunnel oxide film formed on the channel between the source and the drain, a floating gate (charge accumulation layer) formed on the tunnel oxide film, and a MOS structure formed by the insulation layer on the floating-gate accumulation layer to control the gate. When the charges are not accumulated in the floating gate (the data "1" is written), the threshold value is negative, and the memory device is normally on. When the charges are accumulated in the floating gate (the data "0" is written), the threshold value is shifted to be positive, and the memory device is normally off. However, the memory cell could be the single layer cell (SLC) for memorizing one bit (data of two values) or the multi-layer cell (MLC) for memorizing several bits.

Figure 3:
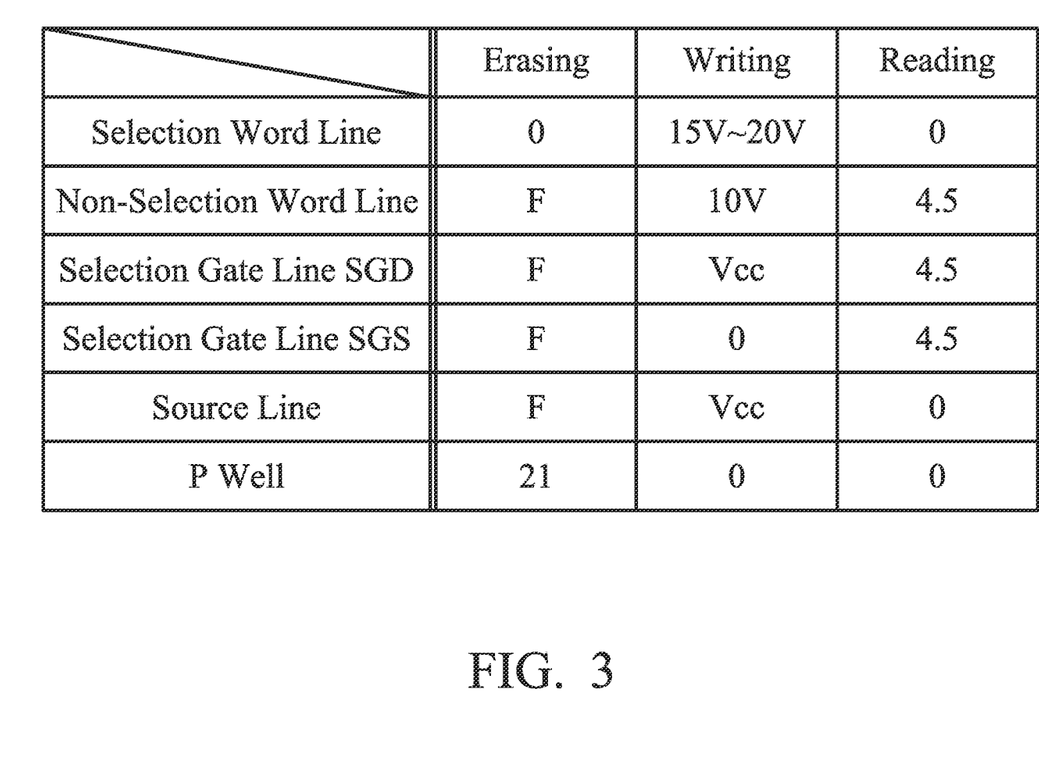
FIG. 3 is a table of an embodiment of bias voltages added to flash memories for various kinds of operations.

FIG. 3 is a table of an embodiment of bias voltages added to flash memories for various operations. When a reading operation is performed, the bit line is biased by a certain positive voltage, the selected word line is biased by a certain voltage (such as 0V), the un-selected word line is biased by the passing voltage Vpass (such as 4.5V), the selected gate lines SGD and SGS are biased by positive voltages (such as 4.5V), the common source line is biased by 0V to turn on the selection transistor TD of the bit line and the selection transistor TS of the source line. When the writing operation is performed, the selected word line is biased with a programming voltage Vpro of high voltages (such as 15 to 20V), the un-selected word line is biased with a voltage of middle value (such as 10V), and the bit line GBL is provided with a voltage level corresponding to the data "0" or "1" to turn on the selection transistor TD of the bit line and the selection transistor TS of the source line. When the erase operation is performed, the selected word line of the group is biased by a voltage of 0V, the P well is biased with a high voltage (such as 20V), the electrons of the floating gate are pulled to the substrate to erase data in units of groups.

The compressor 130 is arranged between the input/output buffer 110 and the ECC circuit 120 to logically compress the input data from the input/output buffer 110 and output the compressed data to the ECC circuit 120. Probably, the compressor 130 extends the compress data from the ECC circuit 120 and outputs the extended data to the input/output buffer 110.

The ECC circuit 120 performs error detection and correction for the entire bit data which is input to the flash memory 10, and also performs error detection and correction for the entire bit data which is outputted from the flash memory 10. More specifically, when the programming operation is performed, the programmed data from the input/output buffer 110 is logically compressed by the compressor 130, and the compressed programming data is performed with the error correction by the ECC circuit 120, and the error-corrected data is transmitted to the page buffer 170. Afterwards, the programming data is written to the page selected by the memory array 100. When the reading operation is performed, the read data from the memory array 100 is transmitted to the page buffer 170, the transmitted data from the page buffer 170 is performed with the error correction by the ECC circuit 120, and the error-corrected data is extended by the compressor 130, and the extended data is provided to the input/output buffer 110.

Figure 4:
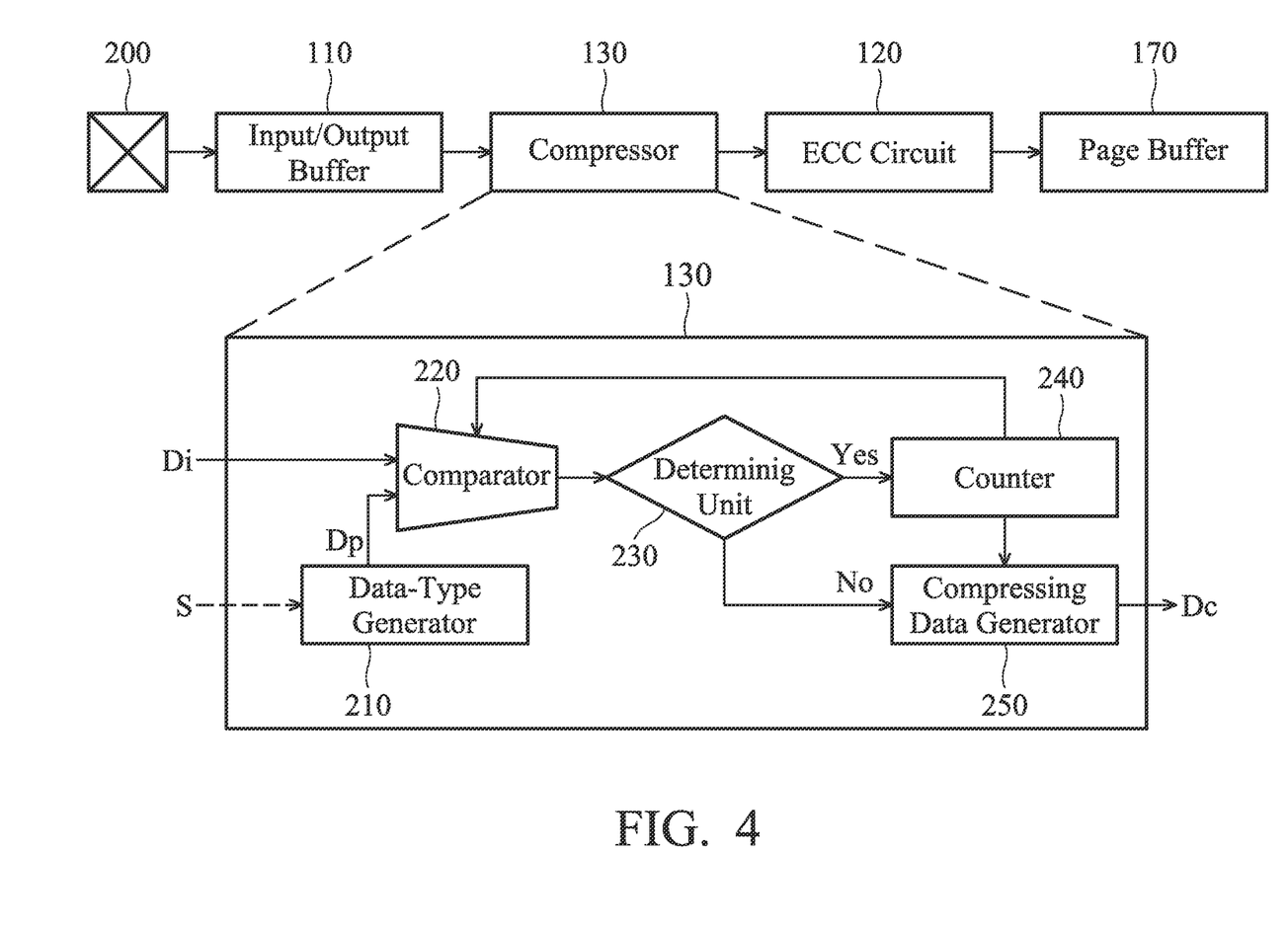
FIG. 4 illustrates the compressing operation when the data is inputted by the flash memory.

FIG. 4 illustrates the structure and the operation of the compressor 130 when the data is inputted by the flash memory. The data added by the external input/output terminal from the flash memory 10 is accumulated on the input/output buffer 110, and it is transmitted from the input/output buffer 110 to the compressor 130. As shown in FIG. 4, the compressor 130 includes a data-type generator 210 which generates data type of N bytes (N is an integer larger than 1), a comparator 220 comparing the input data Di from the input/output buffer 110 and data type Dp of N bytes generated by the data-type generator 210, a determining unit 230 which determines whether the data type Dp is consistent or not with the data type Dp-n of the previous comparing result of the comparator 220 according to the comparing result of the comparator 220, a counter 240 which counts the consistent number when the determining unit 230 determines that the previous data type Dp-n is consistent, and a compressing data generator 250 which generates the compressing data Dc relating the input data Di.

Ideally, the data-type generator 210 generates the data type of N bytes. Still ideally, the data-type generator 210 has a flash memory to store a plurality of data types. It is also ideal that the data-type generator 210 generates a plurality of data types according to predetermined algorithms. The generated data type could have a fixed length or a changeable length. In another embodiment, the data-type generator 210 generates data types having a fixed length or a changeable length according to the control signal S from the controller 150. For example, the controller 150 could set up data types with fixed length or changeable length based on the commands from the external controller. When a higher compression rate is needed, the controller 150 performs compression according to the data type with changeable length. When a lower compression rate is needed, the controller 150 performs compression according to the data type with fixed length.

The comparator 220 compares the input data Di and the data type Dp. Ideally, the comparator 220 is equipped with registers and so on to store the data Di or the data type Dp. When the N bytes of the data type Dp is fixed length, the comparator compares the N-bytes data of the input data Di and the data type Dp of the N bytes. In addition, when the N bytes of the data type Dp is changeable length, the comparator 220 at least stores the data of maximum size of changeable size by the register and so on to perform the comparison of the data type Dp with changeable lengths. The comparator 220 compares the data Di and the data type Dp, and provides the data type Dp which is consistent with the data Di to the determining unit 230 according to the comparing result.

The determining unit 230 is utilized to maintain the data type Dp-n consistent with the previous one, and determines whether the data type Dp which is synchronized by the comparator 220 is consistent with the previous data type Dp-n or not. When Dp is equivalent with the Dp-n, the counter 240 increases the count value with +1 and maintains the count value. The comparator 220 will receives the indication of counting finish from the counter 240, and compares the next data Di and the data type Dp. In addition, when the determining unit 230 determines that Dp is not equivalent to the Dp-n, the context of Dp-n is initialized, and the result of the determination is informed to the compressing data generator 250. The compressing data generator 250 corresponds to the information to generate the compressing data.

Figure 5A:
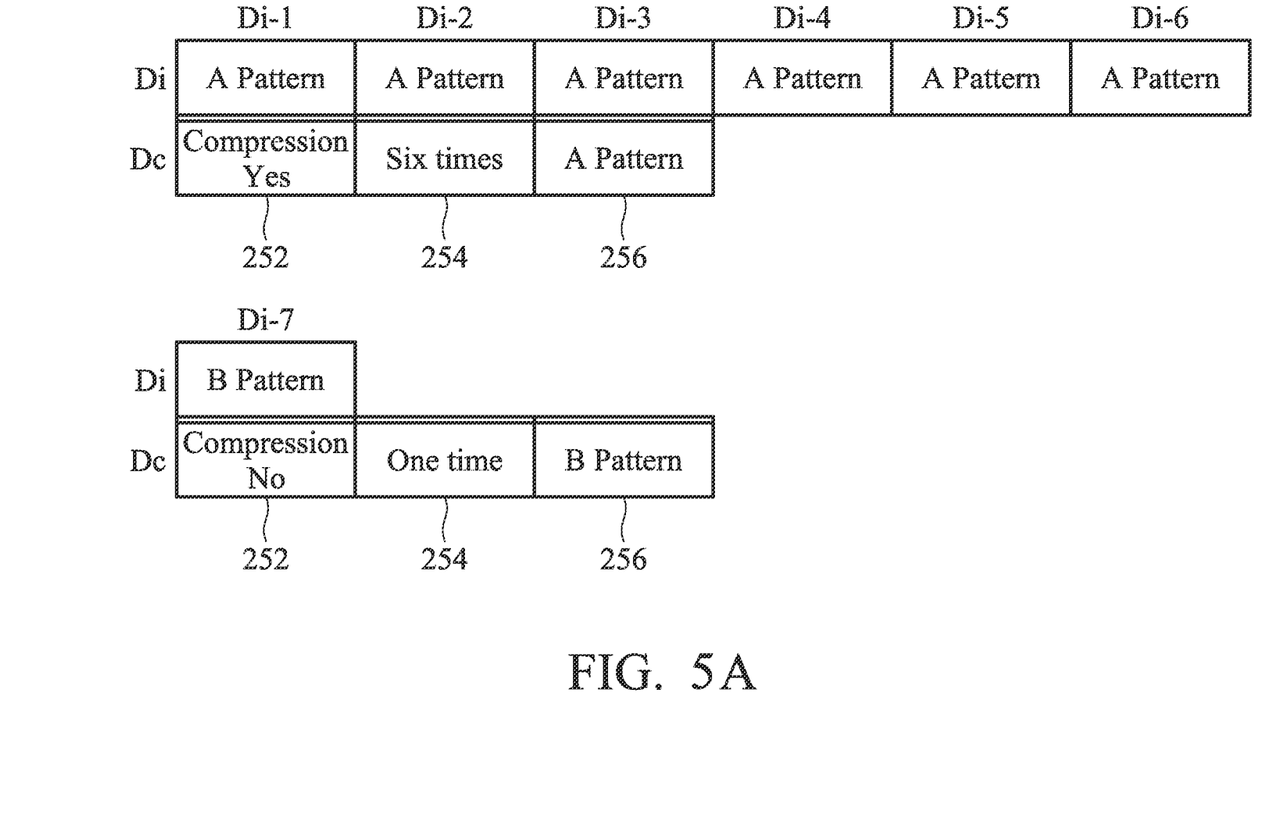
FIGS. 5A and 5B illustrate the embodiments of logical compression of data.

Afterwards, the compressing operations of the compressor 130 are used as examples for illustration. In this embodiment, it is supposed that the compression is executed according to the data type of fixed length of N bytes. As shown in FIG. 5A, the input data Di includes the input data Di-1, Di-2, Di-3, Di-4, Di-5 and Di-6 of "A pattern" of N bytes which repeat 6 times continuously, and the next input data Di-7 of "B pattern".

The comparator 220 compares the data Di-1 of N bytes and the data type Dp of N bytes which is generated or memorized by the data-type generator 210 to detect the consistent data type. In this embodiment, the comparator 220 provides the consistent comparing result of the data Di-1 and the data type "A pattern" to the determining unit 230. In order to initialize Dp-n, the determining unit 230 informs the counter 240 about the consistent comparing result of the two data types and maintains the data type Dp-n equivalent to the "A pattern". The counting value is maintained as one by the counter 240 correspondingly.

Afterwards, the comparator 240 compares the data Di-2 and the data type Dp, and provides the comparing result of the data type Dp which is equivalent to "A pattern" to the determining unit 230. The determining unit 230 determines that Dp is equivalent to Dp-n, and informs the counter 240 about the determining result. The counting value is maintained at two by the counter 240 correspondingly. The operation is repeated in the same way until the data Di-6 when the counting value is maintained at six by the counter 240.

Afterwards, the comparator 220 compares the data Di-7 and the data type Dp, and provides the comparing result of the data type Dp which is equivalent to "B pattern" to the determining unit 230. The determining unit 230 determines that Dp is not equivalent to Dp-n, informs the compressing data generator 250 about the determining result, and initializes Dp-n.

The compressing data generator 250 receives the non-consistent determining result from the determining unit 230 and generates the compressing data Dc relating the data Di-1 to Di-6. The compressing data generator 250 generates the compressing data of the information to identify the repeat numbers of the consistent data type Dp. More practically, the compressing data Dc generated by the compressing data generator 250 includes the identification information 252 "Compression Yes" of the compressing data Di-1 to Di-6, the identification information 254 of the consistency number or the repeat number of the data type (such as the six times illustrated in the above embodiment), and the identification information that the data type is "A pattern". The compressing data generator 250 determines the size of the data and the arrangement of the identification information 250, 252 and 254 according to the predetermined algorithm for the combination as the compressing data Dc.

Figure 5B:
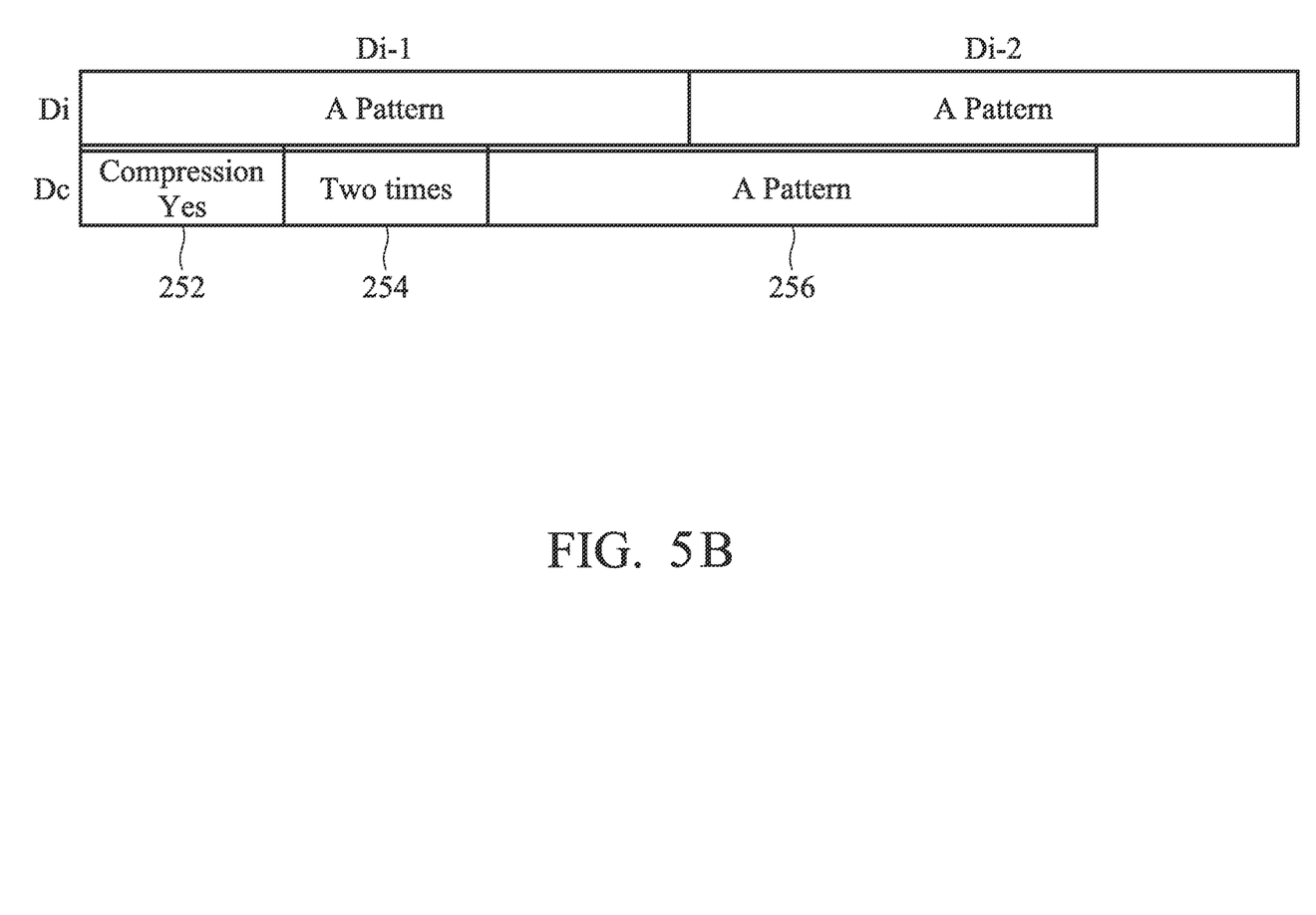

FIG. 5A is utilized to illustrate the embodiment of the "B pattern" without being continuously repeated. Therefore, the identification information 252 is "Compression No", the identification information 254 of the consistency number is "one", the identification information 256 of the data type is "B Pattern". In addition, FIG. 5B illustrates the embodiment of the data type Dp with changeable length. In this embodiment, when the same compression of the fixed length is executed, a higher compression rate could be expected than that of the fixed length.

Figure 6:
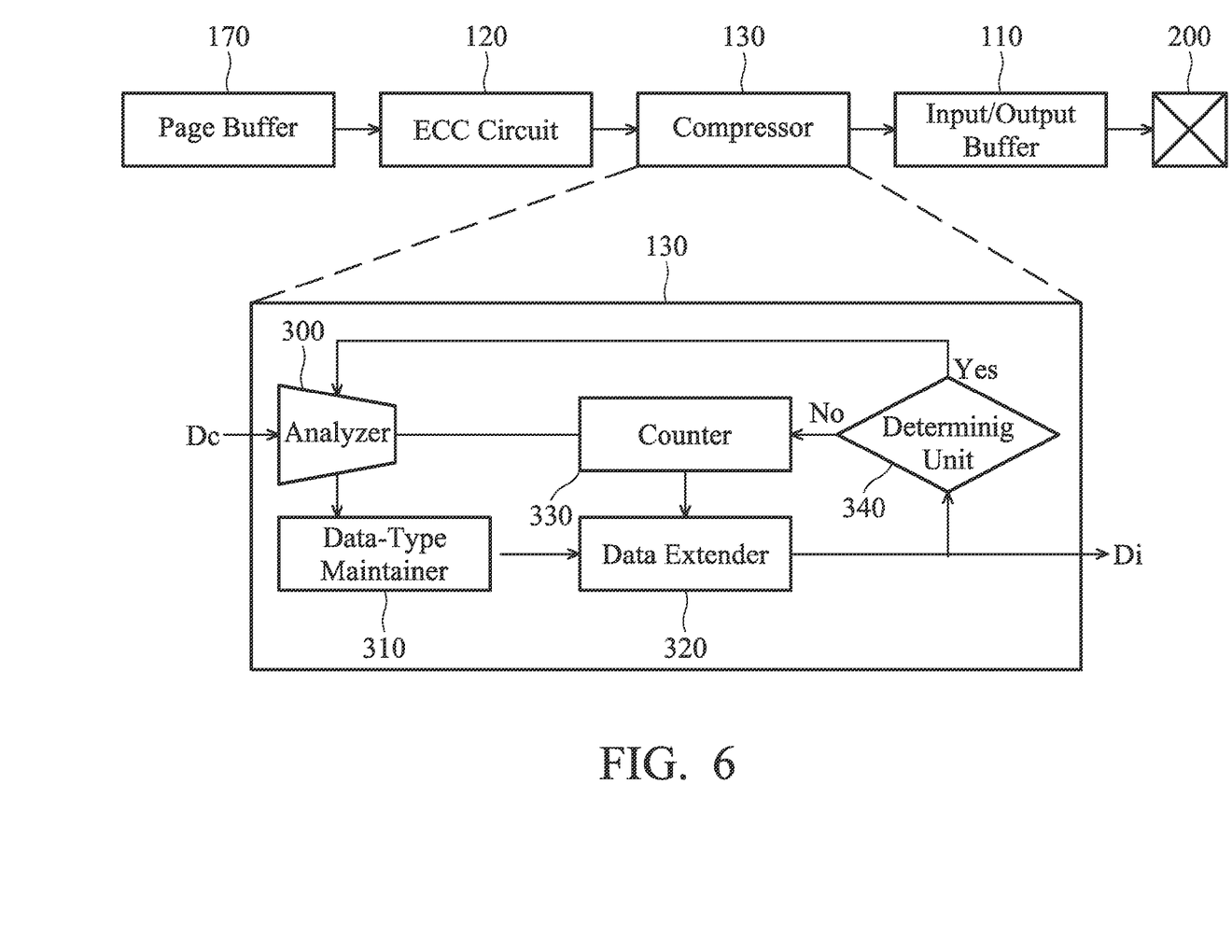
FIG. 6 illustrates the extension operation when data is output from the flash memory according to the embodiment of the present invention.

Afterwards, FIG. 6 illustrates the compositions or operations of the compressor 130 when data is output from the flash memory. The page data read from the memory array 100 is transmitted to the page buffer 170. Afterwards, the error correction is executed by the ECC circuit 120, and the error-corrected data is input to the compressor 130. As shown in FIG. 6, the compressor 130 receives the compressing data Dc. The compressor 130 includes a analyzer 300 which analyzes the identification information 252, 254 and 256 included by the compressing data Dc, a data-type maintainer 310 which maintains the data type Dp based on the identification information 256 analyzed by the analyzer 300, a counter 330 which maintains the consistency number of the data type based on the identification information 254 analyzed by the analyzer 300, a data extender 320 which repeatedly operates the data type maintained by the data-type maintainer 310 and extends the original data Di according to the counting value of the counter 330, and a determining unit 340 which decreases the counting value of the counter 330 by "−1" when one data type is combined by the data extender 320 and determines whether the counting value is zero or not. When the determining unit 340 determines that the counting value is zero, an analyzer 300 receives next compressing data and executes the extension for the compressing data.

Figure 7A:
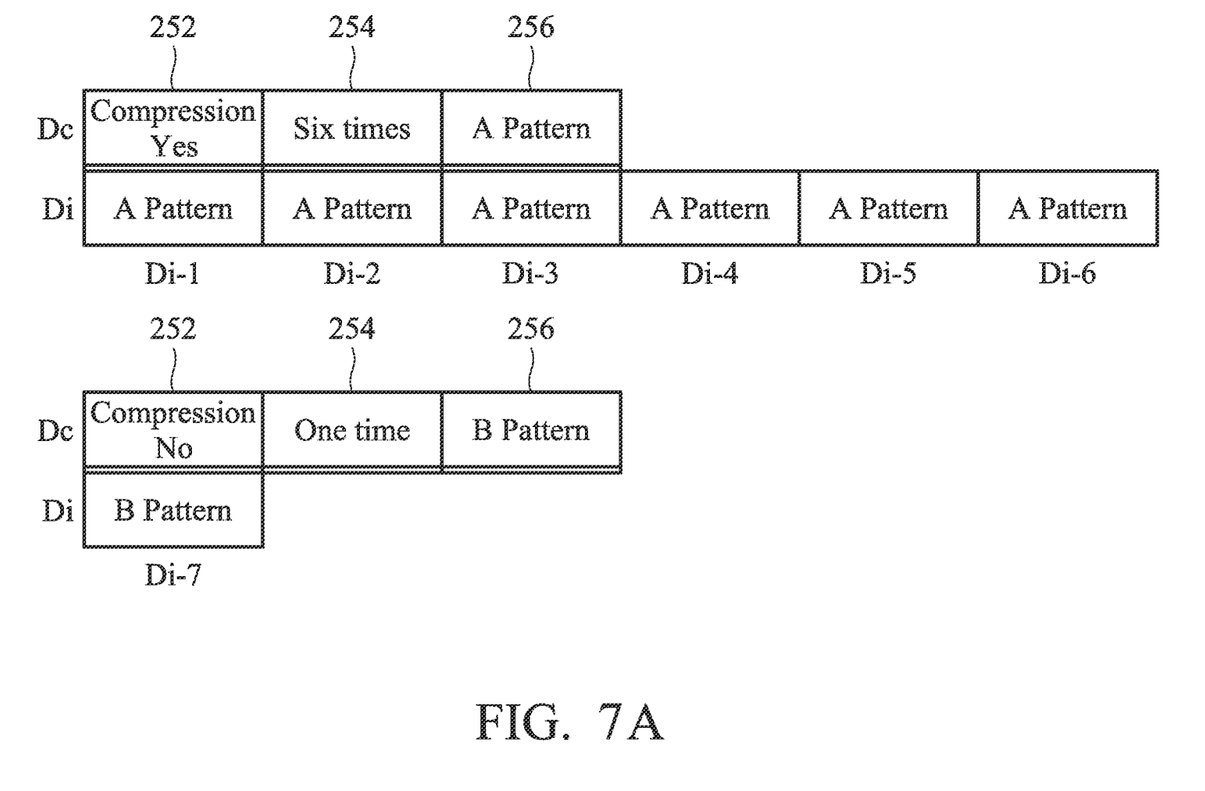
FIGS. 7A and 7B illustrate the embodiments of extension operation of the compressed data.

Afterwards, the extension operation of the compressor 130 is illustrated with the reference of FIG. 7. The extension of the compressive operation as shown in FIG. 5A could be illustrated with it. As shown in FIG. 7A, the analyzer 300 receives the compressing data Dc, and extracts its identification information 252, 254 and 256. The analyzer 300 determines the compression status of the data according to the identification information 252, extracts the consistency number from the identification information 254, and identifies the data type from the identification information 256. Afterwards, the analyzer 300 provides the data type of "A Pattern" to the data-type maintainer 310, and provides the consistency number of the data type of "A Pattern" (six times in the embodiment) to the counter 330. Afterwards, the data extender 320 generates data Di-1 according to the data type from the data-type maintainer 310. After the data Di-1 is generated, the determining unit 340 determines whether the counting value is "0" or not. Because the counting value is not zero, the counter 330 decreases the counting value by one. In this embodiment, the counting value of the counter 330 becomes five. After the decrement is executed by the counter 330, the data extender 320 further generates data Di-2 according to the data type. It is repeated in the same way until the counting value of the counter 330 becomes one. Finally, the data extender 320 generates data Di-1 to Di-6.

Figure 7B:
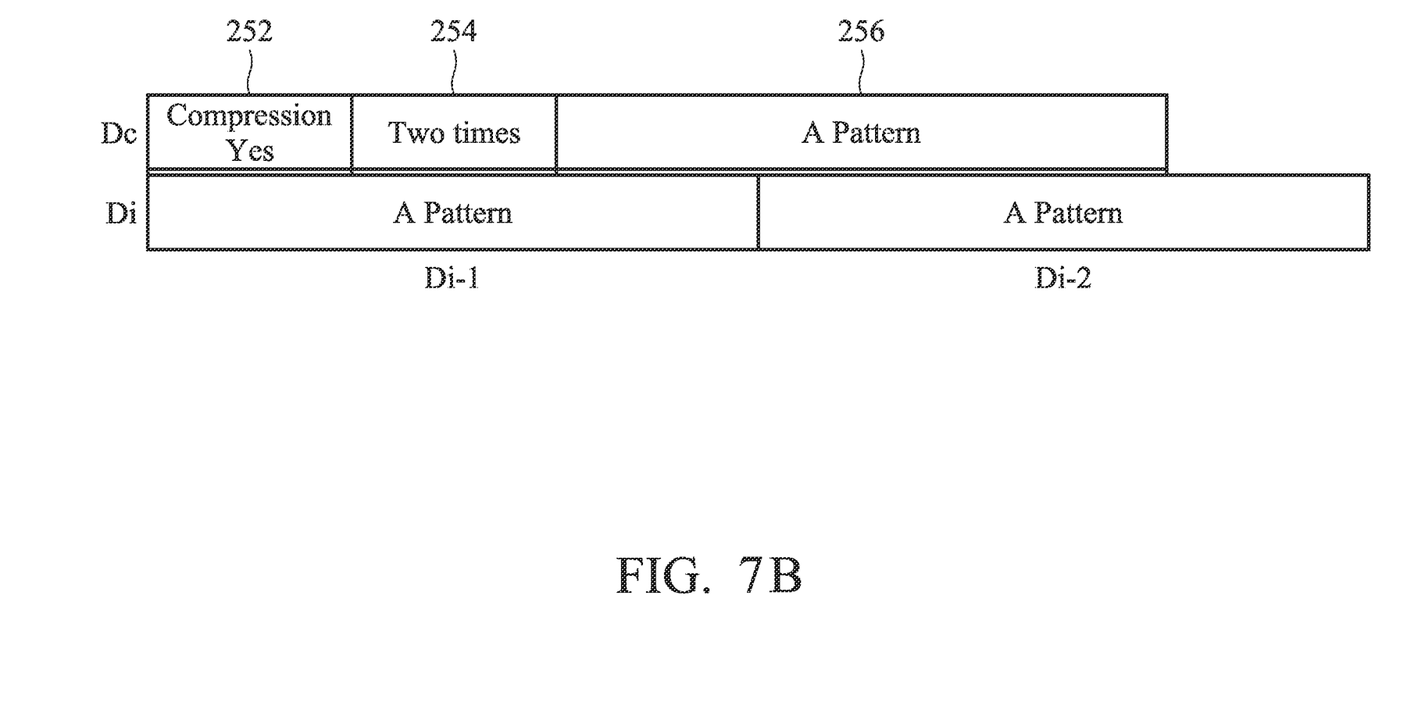

In addition, next compressing data Dc is extended by the same method, and the data Di-7 of "B Pattern" is extended. The embodiment of the extension with changeable length as shown in FIG. 7B corresponds to the embodiment of the extension with fixed length as shown in FIG. 7B.

Figure 8A:
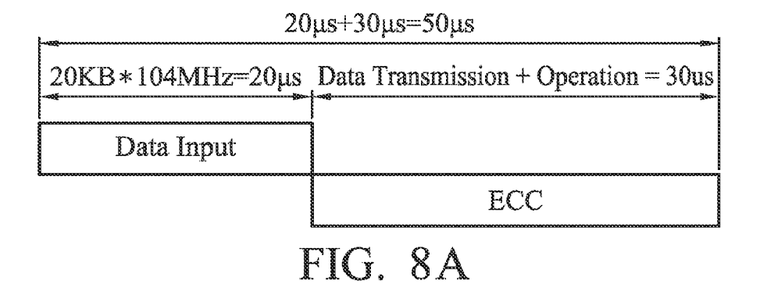
FIGS. 8A~8C illustrate the processing time when data is input by the flash memory of the embodiment according to an embodiment of the present invention.
Figure 8B:
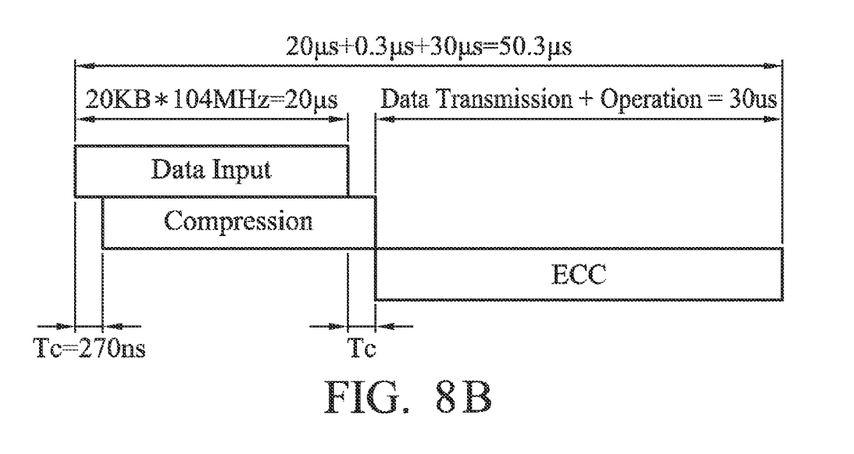
Figure 8C:
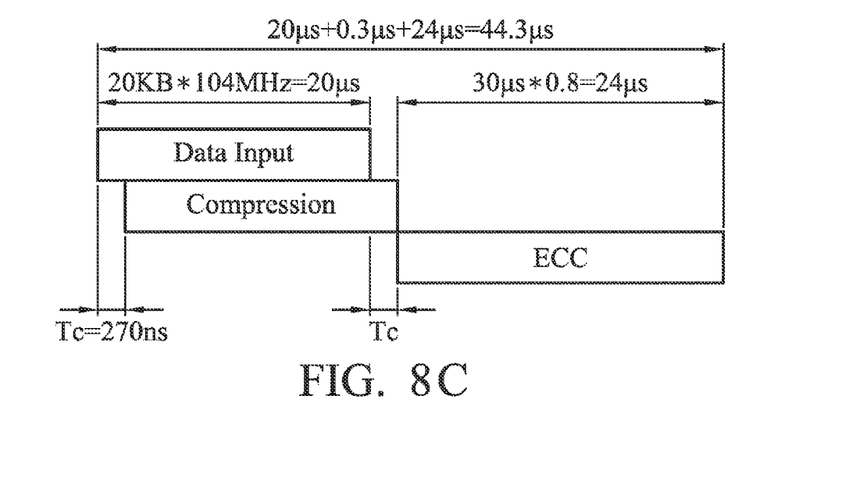

Afterwards, FIGS. 8A~8C illustrate the processing time when data is input by the flash memory of the embodiment. FIG. 8A illustrates a flash memory without the compressor of the embodiment. For example, when a page is 20 KB and the group frequency is 104 MHz, the time it takes to input data from the external input/output terminal to the ECC circuit 120 is about 20 us. In addition, the time that the ECC circuit 120 spends to process the 20 KB data is added to the transmission time from the ECC circuit to the page buffer 170 or from the page buffer 170 to the selected page. The sum of the two times is about 30 us. Accordingly, it totally takes about 50 us from the external input/output terminal to the selected page.

FIG. 8B illustrates the compressor 130 arranged in columns between the ECC circuit 120 and the input/output buffer 110 or the external input/output terminal 200. The delay time Tc caused by the compressor 130 is 270 ns (approximately 0.3 us). The total time spent is about 50.3 us. It should be noted that, in this embodiment, the compression rate of the compressor 130 is ignored.

FIG. 8C illustrates the spent time when the average compression rate of the compressor 130 is supposed to be 80%. When the average compression rate of the compressor 130 is 80%, the 2 KB data of one page could be compressed to 1.6 KB. Therefore, the operation time of the ECC circuit 120 is 24 us (30 us is multiplied by 0.8), and the overall time spent could be decreased to about 44.3 us.

Figure 9A:
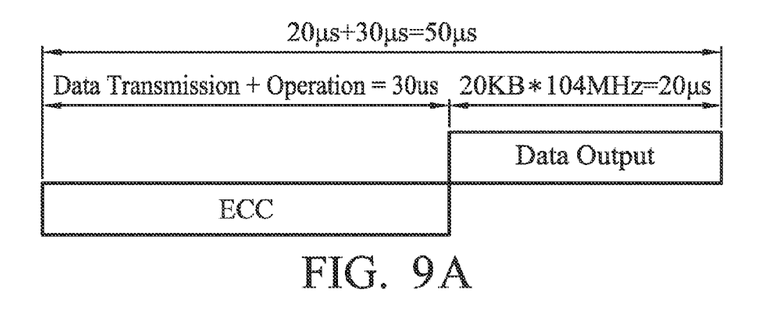
FIGS. 9A~9C illustrate the processing time when data is output from the flash memory according to an embodiment of the present invention.
Figure 9B:
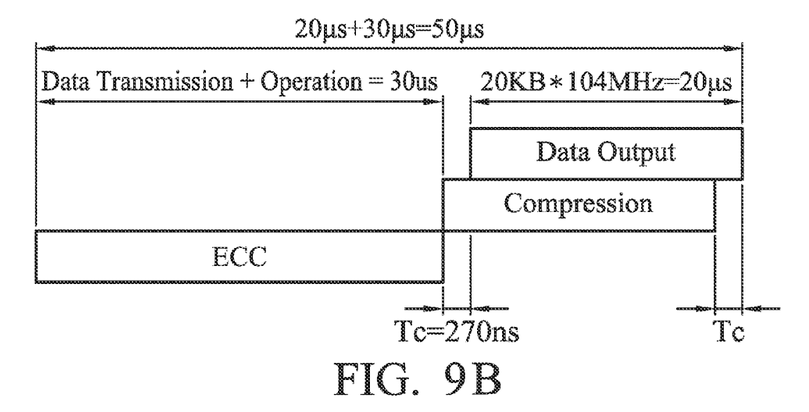
Figure 9C:
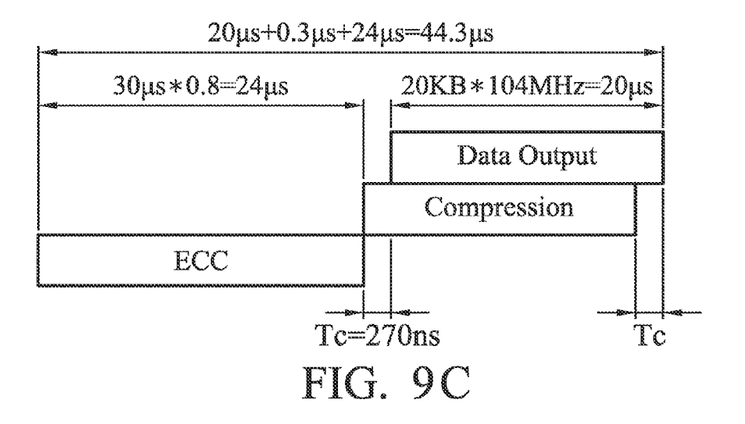

FIGS. 9A~9C illustrate the processing time when data is output from the flash memory. FIG. 9A illustrates a flash memory without the compressor of the embodiment. In this case, similar to the illustration as shown in FIG. 8A, the spent output time from the selected page to the external input/output terminal is about 50 us. FIGS. 9B and 9C correspond to FIGS. 8B and 8C respectively. When the compressor 130 has a compression rate of 80%, the spent time until the data is output is about 44.3 us.

According to the above embodiments, regarding the error correction process executed by the flash memory for the total input/output bit data, the operating time is decreased by the ECC circuit 120 since the compressor 130 is arranged between the ECC circuit 120 and the external input/output terminal or the input/output buffer 110. Accordingly, the input/output time of the data of the flash memory is decreased. Furthermore, the area of the flash memory could be decreased corresponding to the compression rate so that the compressor 130 has the compression rate which is above a certain level.

The second embodiment of the preset invention will be illustrated as follows. In the above embodiment, the error correction of the compression data Dc is executed by the ECC circuit 120. Supposing the compression rate is 80%, the data transmitted from the ECC circuit 120 to the page buffer 170 equals to one page multiplied by 0.8. The data is output to the page buffer 170 in units of pages in the corresponding second embodiment.

Figure 10:
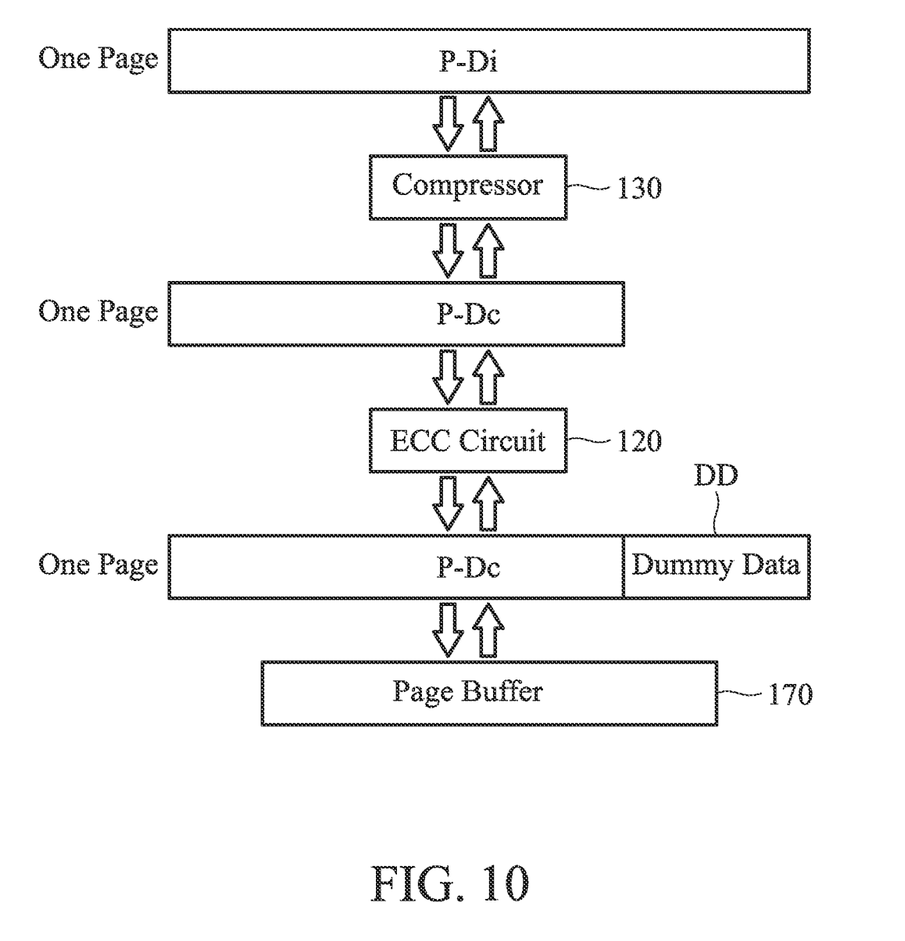
FIG. 10 illustrates the flash memory of the second embodiment of the present invention.

As shown in FIG. 10, the page data P-Di input by the compressor 130 is compressed to become the page data P-Dc and is output to the ECC circuit 120. The ECC circuit 120 performs the error correction process to the compressed page data P-Dc, and adds the dummy data DD corresponding to the compression rate to recover the data size of one page. Meanwhile, the dummy data DD is set up as totally "0" or totally "1". Ideally, the ECC circuit 120 also adds the flag information to identify the dummy data. Therefore, the data of one page size is physically transmitted from the ECC circuit 120 to the page buffer 170, and the page selected by the memory array is programmed.

On the one hand, the data which is read from the page selected by the memory array is transmitted to the page buffer 170, and the one-page data is input to the ECC circuit 120. Referring to the added flag information, the ECC circuit 120 determines whether the dummy data DD is added to the compressed page data P-Dc or not. The ECC circuit 120 erases the overall dummy data DD, executes the error correction process for the compressed page data except it, and provides the error-corrected data to the compressor 130. The compressor 130 extends the compressed page data to become the original page data P-Di. On the contrary, within the flash memory, it is the same as the case without a compressor 130 that the control for the data transmission is performed with the unit of a page.

The present invention is not limited to the specific embodiment. Various changes, replacements and substitutions may be performed by a person with ordinary skill in the art without diverting from the spirit and scope of the present invention recorded by the claims.

In the above embodiment, the embodiment about compression or extension as shown in FIG. 4 and FIG. 6 are utilized as examples, and are not meant to limit the present invention. Other methods of compression or extension with various algorithms or compositional structures could be utilized. Furthermore, in the above embodiment, the compressor is not limited to being arranged between the ECC circuit and the input/output buffer. When the data which is compressed by the compressor is input to the ECC circuit, or when the output data from the ECC circuit is extended by the compressor, the connection arrangement or the position of the compressor is not limited particularly.

While the invention has been described by way of example and in terms of the preferred embodiments, it is to be understood that the invention is not limited to the disclosed embodiments. On the contrary, it is intended to cover various modifications and similar arrangements. Therefore, the scope of the appended claims should be accorded the broadest interpretation so as to encompass all such modifications and similar arrangements.

What is claimed is:

1. A semiconductor memory device, comprising:
    a memory array;
    a data-maintaining component, utilized to maintain data which is read from the memory array, or to maintain data which is written to the memory array;
    an external input/output terminal;
    an error-checking correction (ECC) component, coupled to the data-maintaining component, utilized to execute error detection or correction for data which is input to the data-maintaining component or for output data from the data-maintaining component; and
    a compression component, coupled between the external input/output terminal and the ECC component, utilized to execute compression or extension for data, wherein the compression component compresses data which is provided by the external input/output terminal, provides the compressed data to the ECC component, extends data which is provided from the ECC component, and provides the extended data to the external input/output terminal, and the compression component compresses input data to become data which comprises a data type and a consistency number of the data type.

2. The semiconductor memory device as claimed in claim 1, further comprising an input/output buffer arranged between the external input/output terminal and the compression component.

3. The semiconductor memory device as claimed in claim 1, wherein the compression component compresses input data with logic.

4. The semiconductor memory device as claimed in claim 1, wherein the compression component further comprises:
    a comparator, utilized to compare input data and a data type; and
    a counter, utilized to count the input data and a consistency number of the data type.

5. The semiconductor memory device as claimed in claim 4, wherein the compression component further comprises:
    a data-type generator, utilized to generate data type of N bytes; and
    a determining unit, utilized to determine whether or not data type obtained from a comparing result of the comparator is consistent with last data type compared by the comparator; and
    a compressing data generator, utilized to generate compressed data, wherein when the determining unit determines that it is not consistent, the compressing data generator generates a data type and a compressing data including consistency number of the data type.

6. The semiconductor memory device as claimed in claim 1, wherein the compression component further comprises an extender utilized to extend compressed data including data type and consistency number of the data type to become original data.

7. The semiconductor memory device as claimed in claim 1, wherein the compression component further comprises:
    a counter, utilized to perform decrement operation for consistency number of compressed data; and
    a determining unit, utilized to determine whether a counting value of the counter reaches a predetermined value or not, wherein the extender generates connection of the data type until the determining unit determines that the predetermined value is reached.

8. The semiconductor memory device as claimed in claim 1, wherein the ECC component adds dummy data which is totally "0" or totally "1" for the compressed data.

9. The semiconductor memory device as claimed in claim 1, wherein the data type has a changeable length.

10. The semiconductor memory device as claimed in claim 1, wherein the memory array is a NAND-type memory array.

* * * * *